(12) United States Patent
Ishida et al.

(10) Patent No.: US 6,219,535 B1
(45) Date of Patent: Apr. 17, 2001

(54) SEMICONDUCTOR AMPLIFIER AND FREQUENCY CONVERTER

(75) Inventors: Hidetoshi Ishida, Kyoto; Daisuke Ueda, Ibaraki, both of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/092,438

(22) Filed: Jun. 5, 1998

(30) Foreign Application Priority Data

Jun. 6, 1997 (JP) .................................................. 9-148856

(51) Int. Cl.⁷ ........................................................ H04B 1/28
(52) U.S. Cl. ......................... 455/333; 455/323; 455/326; 327/113; 327/119; 327/359
(58) Field of Search .................................... 455/313, 323, 455/325, 326, 333; 327/113, 116, 119, 356, 359

(56) References Cited

U.S. PATENT DOCUMENTS 4,334,324 * 6/1982 Hoover .................................. 455/333
4,677,692 * 6/1987 Sakashita et al. .................... 455/326

* cited by examiner

*Primary Examiner*—Lee Nguyen
(74) *Attorney, Agent, or Firm*—Ratner & Prestia

(57) ABSTRACT

A semiconductor circuit includes at least first and second field effect transistors. A source electrode of the first field effect transistor is connected to a drain electrode of the second field effect transistor via a first AC current blocking element and is also grounded via a bypass capacitor. A drain electrode of the first field effect transistor is connected to a power supply. A source-drain voltage of the first field effect transistor is equal to or higher than a pinch-off voltage of the first field effect transistor. A source-drain voltage of the second field effect transistor is equal to or higher than a pinch-off voltage of the second field effect transistor.

4 Claims, 4 Drawing Sheets

US 6,219,535 B1

SEMICONDUCTOR AMPLIFIER AND FREQUENCY CONVERTER

BACKACKGROUND OF THE INVENTION

1. Field of the Invention

The present invention relates to a semiconductor circuit for performing amplification and frequency conversion of a high frequency signal in a mobile communication device, in particular, a cellular phone.

2. Description of the Related Art

Recently, as mobile communication devices such as cellular phones have become more prevalent, higher performance of the mobile communication devices, especially extended usage times have been demanded. As used herein, usage time is conversation time plus standby time. Since the recordable time is mainly determined by the power consumption of a semiconductor circuit for receiving high frequency signals (front end IC), the power consumption of the semiconductor circuit needs to be reduced.

A conventional semiconductor circuit for a cellular phone will be described with reference to FIG. 2. FIG. 2 is a block diagram of a semiconductor circuit 200 having three active elements. A low noise amplifier 1 and a local amplifier 2, which are connected to each other in parallel, are connected to a mixer 3 in series. These three active elements 1, 2 and 3 are each directly supplied with power by a constant voltage supply. The three active elements 1, 2 and 3 each include a GaAs field effect transistor (hereinafter, referred to as an "FET") in order to improve the high frequency characteristics.

The semiconductor circuit 200 operates in the following manner.

A high frequency signal having a frequency f1 which is received by an antenna of a cellular phone is input to the low noise amplifier 1 through an input terminal 1a. The high frequency signal is amplified by the low noise amplifier 1 and then input to the mixer 3. A constant frequency signal having a frequency f2 which is generated by a local oscillator (not shown) is input to the local amplifier 2 through an input terminal 2a. The constant frequency signal is amplified by the local amplifier 2 and then input to the mixer 3. A synthesis signal having an intermediate frequency f1–f2 is output from an output terminal 3a of the mixer 3.

The structure of the semiconductor circuit 200 shown in FIG. 2 will be described in more detail with reference to FIG. 3. FIG. 3 is a circuit diagram illustrating a detailed configuration of the conventional semiconductor circuit 200. The low noise amplifier 1 includes a FET 4. The FET 4 is formed from GaAs. A gate electrode 4g of the FET 4 is grounded via a gate bias resistor 5. A source electrode 4s of the FET 4 is grounded by a bypass capacitor 6 and a self-bias resistor 7, which are connected to each other in parallel. The self-bias resistor 7 is provided in order to alleviate the instability in the amount of drain current which is caused by dispersion in the threshold voltage of the FET 4.

The local amplifier 2 includes another FET 9. A gate electrode 9g of the FET 9 is grounded via a gate bias resistor 10. A source electrode 9s of the FET 9 is grounded via a bypass capacitor 11 and a self-bias resistor 12, which are connected to each other in parallel.

The mixer 3 includes still another FET 14. Gate electrodes 14g1 and 14g2 of the FET 14 are respectively grounded via gate bias resistors 15 and 16. A source electrode 14s of the FET 14 is grounded via a bypass capacitor 17 and a self-bias resistor 18, which are connected to each other in parallel.

A drain electrode 4d of the FET 4 is connected to the gate electrode 14g1 of the FET 14 via a coupling capacitor 8, and a drain electrode 9d of the FET 9 is connected to the gate electrode 14g2 of the FET 14 via a coupling capacitor 13.

The input terminals 1a and 2a and the output terminal 3a are respectively connected to the gate electrodes 4g and 9g and the drain electrode 14d.

As a power supply, a 3 V lithium battery 19 is used. The drain electrodes 4d, 9d and 14d are each supplied with a voltage of 3 V.

In accordance with a known method, the power consumption of the semiconductor circuit 200 is reduced by shortening the gate length of the FETs 4, 9 and 14 to 0.6 μm and thus reducing the amount of the drain current.

FIG. 4 is a graph illustrating the relationship between the source-drain voltage (potential difference between the source electrode 4s and the drain electrode 4d) and the amount of the drain current of the FET 4. As can be appreciated from FIG. 4, when the source-drain voltage is equal to or higher than the pinch-off voltage Vp, the amount of the drain current becomes constant. When the amount of the drain current is constant, the amplification ratio of the FET is constant. Accordingly, even when the source-drain voltage changes in the range of the pinch-off voltage Vp or higher, the amplification ratio of the FET is constant.

When the source-drain voltage increases, the power consumption of the FET increases. The power consumption is reduced without changing the amplification ratio of the FET, i.e., without changing the amount of the drain current by reducing the source-drain voltage in the range of no less than the pinch-off voltage Vp.

However, the conventional semiconductor circuit 200 of the cellular phone has a power supply including a 3 V lithium battery or three 1.2 V nickel hydrogen batteries connected in series to provide a voltage of 3.6 V in total. Therefore, the FET 4 operates at a voltage A in FIG. 4, which is significantly higher voltage than the pinch-off voltage Vp. Thus, the power supply used in the conventional semiconductor circuit 200 of the cellular phone provides a voltage which is excessively high for the FET included therein, and thus the power is wasted.

An FET having a gate length of less than 0.6 μm has a withstand voltage which is excessively low and sometimes causes abnormal operation when a voltage of 3 V is applied between the source and the drain.

SUMMARY OF THE INVENTION

A semiconductor circuit according to the present invention includes at least first and second field effect transistors. A source electrode of the first field effect transistor is connected to a drain electrode of the second field effect transistor via a first AC current blocking element and is also grounded via a bypass capacitor. A drain electrode of the first field effect transistor is connected to a power supply. A source-drain voltage of the first field effect transistor is equal to or higher than a pinch-off voltage of the first field effect transistor. A source-drain voltage of the second field effect transistor is equal to or higher than a pinch-off voltage of the second field effect transistor.

In one embodiment of the invention, the semiconductor circuit further includes at least one third field effect transistor and at least one second AC current blocking element. Each third field effect transistor is connected to one AC current blocking element. A drain electrode of the third field effect transistor is connected to the source electrode of the first field effect transistor via the first AC current blocking element. A source electrode of the third field effect transistor is connected to the drain electrode of the second field effect transistor via the second AC current blocking element. A source-drain voltage of the third field effect transistor is equal to or higher than a pinch-off voltage of the third field effect transistor.

In one embodiment of the invention, the semiconductor circuit further includes a gate voltage supply circuit. Gate electrodes of the first and third field effect transistors are connected to the gate voltage supply circuit. An end of the gate voltage supply circuit is connected to the power supply.

In one embodiment of the invention, the source electrode of the second field effect transistor is grounded via a resistor and a bypass capacitor which are connected to each other in parallel.

Thus, the invention described herein makes possible the advantage of providing a semiconductor circuit having a lower power consumption.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
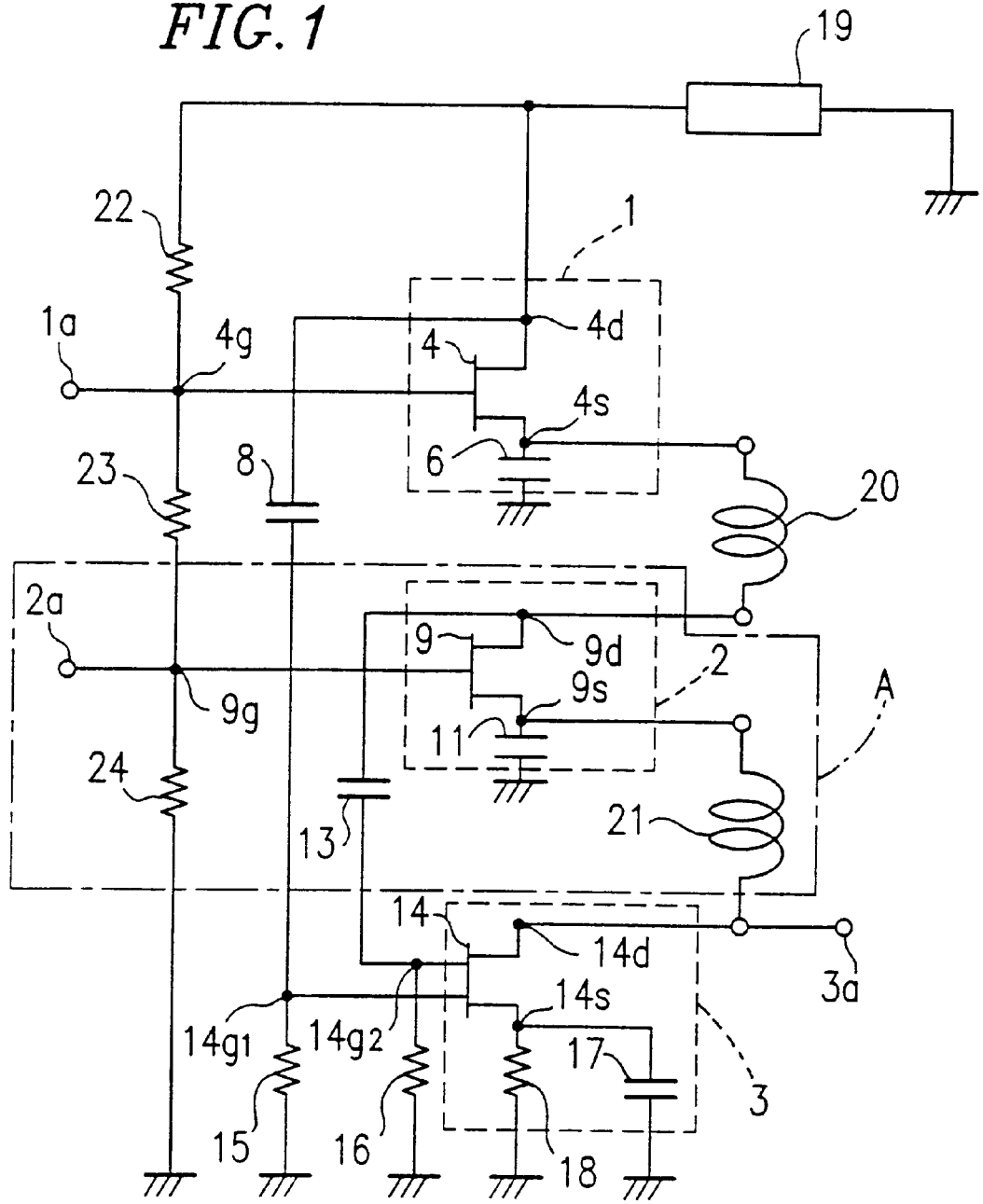
FIG. 1 is a circuit diagram illustrating a configuration of a semiconductor circuit in an example according to the present invention.
Figure 2:
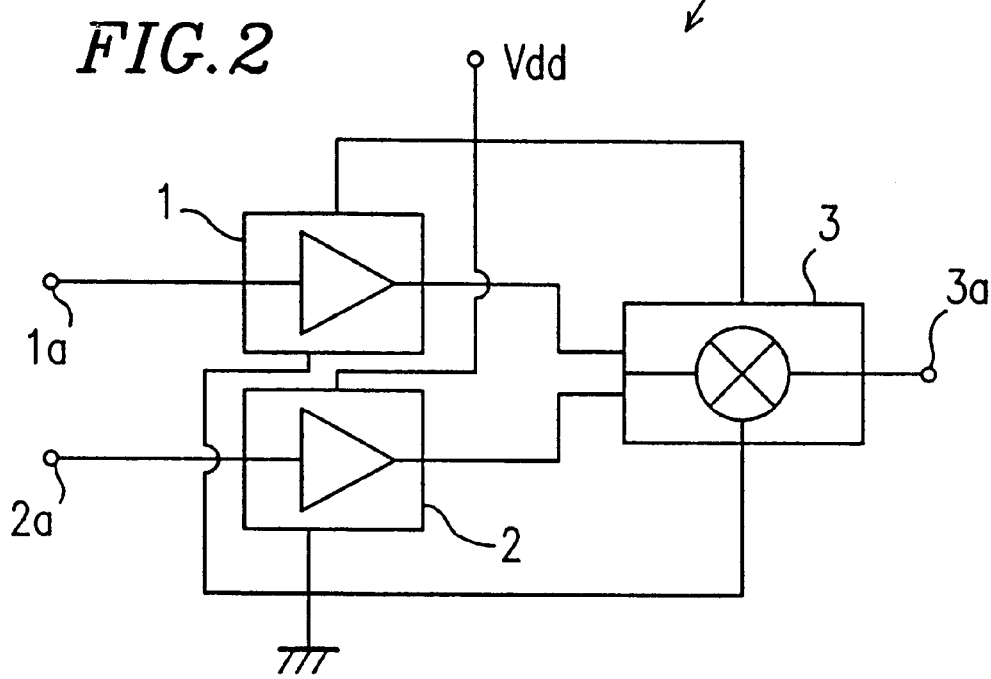
FIG. 2 is a block diagram of a conventional semiconductor circuit.
Figure 3:
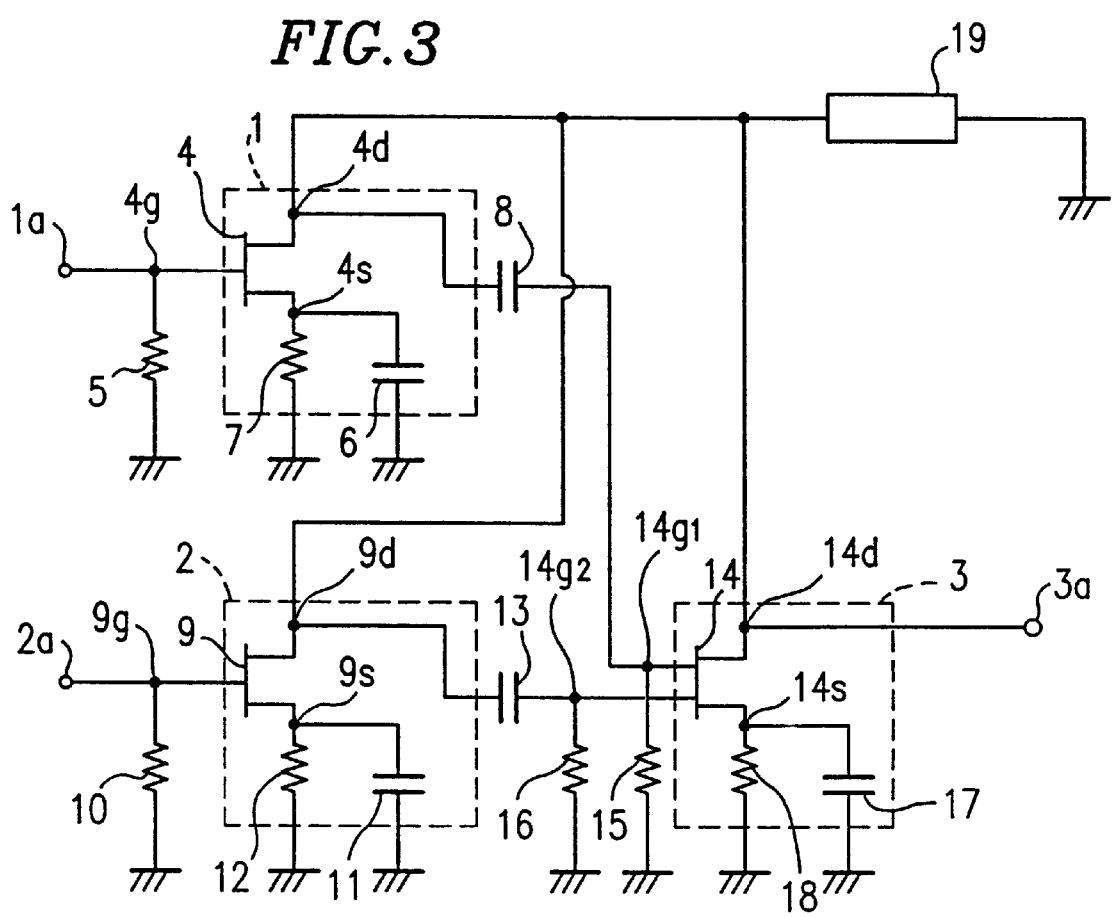
FIG. 3 is a circuit diagram illustrating a detailed configuration of the conventional semiconductor circuit.
Figure 4:
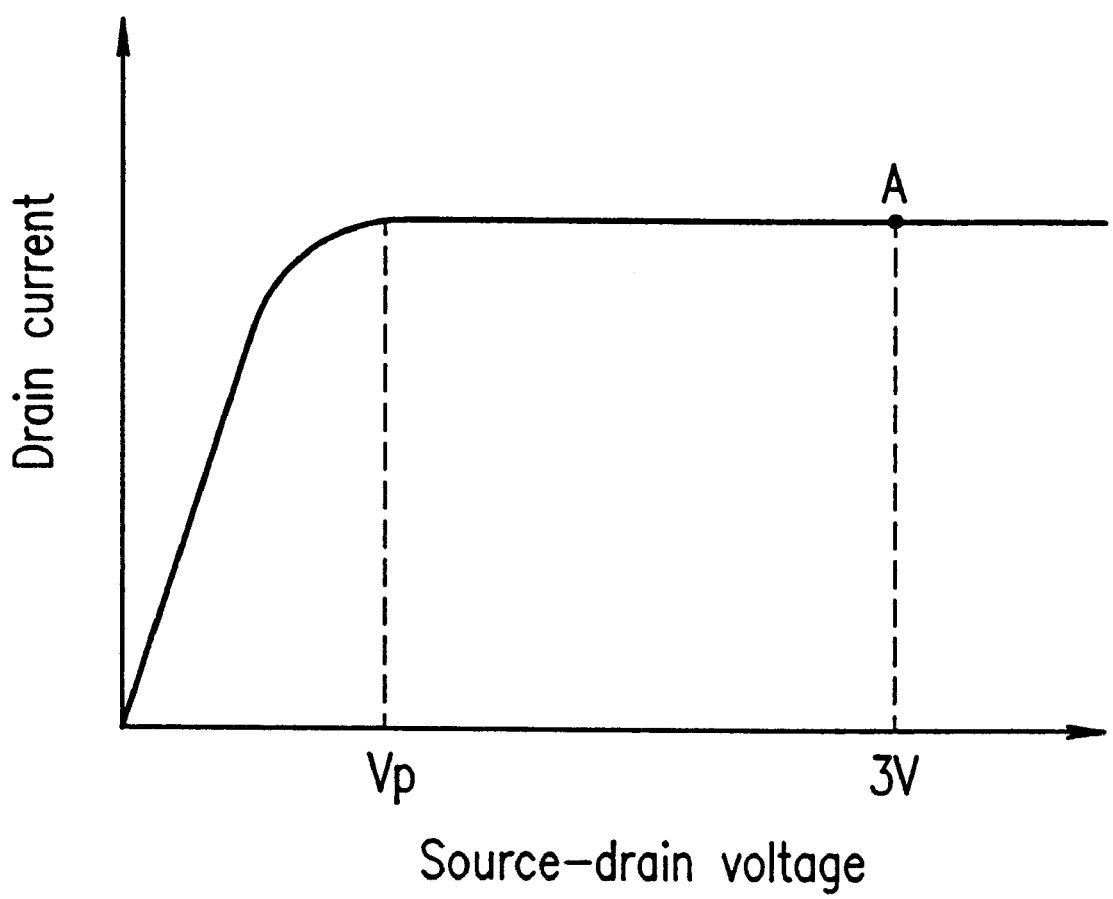
FIG. 4 is a graph illustrating a current characteristic of an FET.

FIG. 1 is a circuit diagram illustrating a configuration of a semiconductor circuit 100 for receiving a high frequency signal in an example according to the present invention. Identical elements previously discussed with respect to FIGS. 2 and 3 bear identical reference numerals and the descriptions thereof will be omitted.

The semiconductor circuit 100 shown in FIG. 1 includes three active elements 1, 2 and 3. The active element 1 includes a FET 4 (first FET), the active element 2 includes a FET 9 (third FET), and the active element 3 includes a FET 14 (second FET).

A drain electrode 4d of the FET 4 is connected to a 3 V lithium battery 19. A source electrode 4s of the FET 4 is grounded via a bypass capacitor 6, and is also connected to a drain electrode 9d of the FET 9 via a choke coil 20 acting as an AC current blocking element for blocking any AC components of the current.

A source electrode 9s of the FET 9 is grounded via a bypass capacitor 11 and is also connected to a drain electrode 14d of the FET 14 via a choke coil 21 acting as an AC current blocking element for blocking any AC components of the current. A source electrode 14s of the FET 14 is grounded via a bypass capacitor 17 and a self-bias resistor 18 which are connected to each other in parallel.

The drain electrode 4d of the FET 4 is connected to a gate electrode 14g1 of the FET 14 via a coupling capacitor 8. The drain electrode 9d of the FET 9 is connected to a gate electrode 14g2 of the FET 14 via a coupling capacitor 13. The gate electrodes 14g1 and 14g2 are respectively grounded via the gate bias resistors 15 and 16.

The gate electrode 4g of the FET 4 and the gate electrode 9g of the FET 9 are respectively connected to input terminals 1a and 2a. The drain electrode 14d of the FET 14 is connected to an output terminal 3a.

Gate bias resistors 22, 23 and 24, which are included in a gate voltage supply circuit, are connected in series. One end of the gate bias resistor 22 is connected to the lithium battery 19, and the other end of the gate bias resistor 22 is connected to the gate electrode 4g. One end of the gate bias resistor 23 is connected to the gate electrode 4g, and the other end of the gate bias resistor 23 is connected to the gate electrode 9g. One end of the gate bias resistor 24 is connected to the gate electrode 9g, and the other end of the gate bias resistor 24 is grounded. The resistances of the gate bias resistors 22, 23 and 24 are set so that the source-drain voltage of the FET 4 and the source-drain voltage of the FET 9 are equal to or higher than the pinch-off voltages of the respective FETs 4 and 9.

The semiconductor circuit 100 operates in, for example, the following manner.

The basic operation of the semiconductor circuit, 100 is substantially the same as that of the conventional semiconductor circuit 200. A weak high frequency signal having a frequency f1 which is received by an antenna of a cellular phone is input to the gate electrode 4g through the input terminal 1a. The high frequency signal is amplified by the FET 4 and then input to the gate electrode 14g1 via the coupling capacitor 8. A constant frequency signal having a frequency f2 which is generated by a local oscillator (not shown) is input to the gate electrode 9g through the input terminal 2a. The constant frequency signal is amplified by the FET 9 and then input to the gate electrode 14g2 via the coupling capacitor 13. A synthesis signal having an intermediate frequency f1–f2 is output from the output terminal 3a via the drain electrode 14d of the FET 14.

In the semiconductor circuit 100 in this example, the potentials of the gate electrodes 14g1 and 14g2 of the FET 14 are fixed to a ground potential respectively by the gate bias resistors 15 and 16. Therefore, the source-drain voltage of the FET 14 is equal to or higher than the pinch-off voltage. Consequently, the amount of drain current of the FET 4 is constant regardless of the source-drain voltage.

The potential of the gate electrode 9g with respect to the potential of the source electrode 9s is 10 fixed by the gate bias resistors 22, 23 and 24 to be equal to or higher than the pinch-off voltage. Therefore, the potential of the source electrode 9s of the FET 9 is determined so as to allow an equal amount of current to flow in the FET 9 as that of the current flowing in the FET 14.

The potential of the gate electrode 4g with respect of the potential of the source electrode 4s is fixed by the gate bias resistors 22, 23 and 24 to be equal to or higher than the pinch-off voltage. Therefore, the potential of the source electrode 4s of the FET 4 is determined so as to allow an equal amount of current to flow in the FET 4 as that of the current flowing in the FET 9.

The sum of the voltages applied between the source and the drain of each of the FETs 4, 9 and 14 is equal to 3 V, which is supplied by the power supply 19. The characteristics of the three FETS 4, 9 and 14 are substantially equal to one another. Accordingly, the voltage of 3 V supplied by the power supply 19 is substantially equally divided into three; i.e., a voltage of about 1 V is applied between the source and the drain of each FET. In other words, the source-drain voltage is reduced to 1 V from the conventional voltage of 3 V, the power consumption in each FET is significantly reduced. Since the source-drain voltage is set to be no less than the pinch-off voltage, the amplification ratio of the FET is not reduced more than in the conventional semiconductor circuit 200. Accordingly, the frequency characteristics are maintained at a sufficiently high level.

As described above, the voltage applied between the source and the drain of each FET is reduced according to the present invention. Therefore, the power consumption of each FET is reduced, which reduces the power consumption of the overall circuit.

Portion A of the semiconductor circuit 1 can be eliminated, in which case the source electrode 4s of the FET 4 is connected to the drain electrode 14d of the FET 14 via the choke coil 20.

Alternatively, a plurality of portions A can be connected in series.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor circuit, comprising at least first and second field effect transistors, wherein:
   a source electrode of the first field effect transistor is connected top a drain electrode of the second field effect transistor via a first AC current blocking element and is also grounded via a bypass capacitor,
   a drain electrode of the first field effect transistor is connected to a power supply,
   a source-drain voltage of the first field effect transistor is equal to or higher than a pinch-off voltage of the first field effect transistor, and
   a source-drain voltage of the second field effect transistor is equal to or higher than a pinch-off voltage of the second field effect transistor,
   wherein the drain outputs of the first and second field effect transistors are respectively inputted into a single mixer.

2. A semiconductor circuit, comprising at least first and second field effect transistors, wherein:
   a source electrode of the first field effect transistor is connected to a drain electrode of the second field effect transistor via a first AC current blocking element and is also grounded via a bypass capacitor,
   a drain electrode of the first field effect transistor is connected to a power supply,
   a source-drain voltage of the first field effect transistor is equal to or higher than a pinch-off voltage of the first field effect transistor, and
   a source-drain voltage of the second field effect transistor is equal to or higher than a pinch-off voltage of the second field effect transistor,
   the semiconductor circuit further comprising at least one third field effect transistor and at least one second AC current blocking element, wherein:
   each third field effect transistor is connected to one AC current is blocking element,
   a drain electrode of the third field effect transistor is connected to the source electrode of the first field effect transistor via the first AC current blocking element,
   source electrode of the third field effect transistor is connected to the drain electrode of the second field effect transistor via the second AC current blocking element, and
   a source-drain voltage of the third field effect transistor is equal to or higher than a pinch-off voltage of the third field effect transistor.

3. A semiconductor circuit according to claim 2, further comprising a gate voltage supply circuit, wherein gate electrodes of the first and third field effect transistors are connected to the gate voltage supply circuit, and an end of the gate voltage supply circuit is connected to the power supply.

4. A semiconductor circuit according to claim 3, wherein the source electrode of the second field effect transistor is grounded via a resistor and a bypass capacitor which are connected to each other in parallel.

* * * * *

UNITED STATES PATENT AND TRADEMARK OFFICE
CERTIFICATE OF CORRECTION

PATENT NO. : 6,219,535 B1
DATED : April 17, 2001
INVENTOR(S) : Ishida et al.

It is certified that error appears in the above-identified patent and that said Letters Patent is hereby corrected as shown below:

Column 6,
Line 27, "source" should read -- a source --.

Signed and Sealed this

Twenty-sixth Day of February, 2002

Attest:

JAMES E. ROGAN
Attesting Officer
Director of the United States Patent and Trademark Office